United States Patent [19]
Fogal et al.

[11] Patent Number: 5,559,366
[45] Date of Patent: Sep. 24, 1996

[54] LEAD FINGER TREAD FOR A SEMICONDUCTOR LEAD PACKAGE SYSTEM

[75] Inventors: Rich Fogal; Michael B. Ball, both of Boise, Id.

[73] Assignee: Micron Technology, Inc., Boise, Id.

[21] Appl. No.: 285,974

[22] Filed: Aug. 4, 1994

[51] Int. Cl.⁶ .................................................. H01L 23/48
[52] U.S. Cl. .......................... 257/666; 257/676; 257/692; 257/739
[58] Field of Search ..................... 257/666, 692, 257/676, 739

[56] References Cited

U.S. PATENT DOCUMENTS

| | | | |
|---|---|---|---|
| 4,862,246 | 8/1989 | Masuda | 257/666 |
| 5,358,906 | 10/1994 | Lee | 257/666 |

FOREIGN PATENT DOCUMENTS

| | | | |
|---|---|---|---|
| 61-1041 | 1/1986 | Japan | 257/739 |
| 61-48951 | 3/1986 | Japan . | |
| 63-42155 | 2/1988 | Japan . | |
| 284867 | 12/1991 | Japan . | |

*Primary Examiner*—William Mintel
*Assistant Examiner*—Roy Potter
*Attorney, Agent, or Firm*—Hopkins, Roden, Crockett, Hansen & Hoopes

[57] ABSTRACT

A lead finger of a lead frame in a lead package system for a semiconductor die includes a tread on a surface of the lead finger for increasing adhesion between the finger and an adhesive tape, the tape communicating between the tread and the die. The tread substantially minimizes lead finger bounce upon wire bonding the lead finger with the die. The tread is patterned to provide optimum surface area for adhesion with the adhesive tape. The tread includes a groove and/or cavity stamped or etched on the surface of the lead finger.

12 Claims, 3 Drawing Sheets

5,559,366

LEAD FINGER TREAD FOR A SEMICONDUCTOR LEAD PACKAGE SYSTEM

TECHNICAL FIELD

This invention relates, in general, to a semiconductor lead package system and, more particularly, to a lead finger in a lead frame having a tread for increasing adhesion to an adhesive tape.

BACKGROUND OF THE INVENTION

In the computing industry in general, the trend is to make products smaller, faster, and better. Likewise, the trend in the semiconductor industry is to shrink packaging requirements for integrated circuit (IC) devices. Accordingly, variations in packaging techniques have evolved.

A semiconductor IC packaged device generally includes an IC chip (die) being connected to inner leads of a lead frame by wire bonds. The chip, wire bonds, and inner leads are completely encapsulated for protection with a substance, such as plastic. Outer leads communicate with the inner leads of the lead frame, but the outer leads typically remain exposed for mounting of the packaged device to some other external circuitry, such as a printed circuit board.

In a conventional IC packaged device, a semiconductor die is placed on and bonded to a center die paddle of a lead frame for support. Inner lead fingers of the lead frame approach the paddle but do not contact or communicate with the paddle. Rather, wire bonds communicate between contact pads on the die and the inner lead fingers of the lead frame by spanning the gap between the die and the fingers. The wire bonds allow for the transmission of the electrical signals to and from the die and the lead frame.

To shrink the conventional packaging requirements, techniques such as the Lead On Chip (LOC) method have been developed. The LOC technique disposes the inner lead fingers of a lead frame directly over the die (or IC chip) rather than away from the die. Double-sided adhesive insulating tape attaches the conductive lead fingers to the die so that no gap exists between the die and lead fingers. The wire bonds generally communicate between contact pads on the die and the inner lead fingers which are disposed directly over a portion of the die adjacent the die pads. The tape is subsequently cured to a hardened state wherein the lead fingers are fixedly attached thereto.

This LOC technique allows the entire packaging of the IC device to be smaller. Similar to LOC, other variations of using an adhesive tape for shrinking packaging requirements include a Tape Under Frame technique and a Leads Under Die method.

Although IC packaging is minimized in each of these packaging techniques that uses an adhesive tape, other problems surface. One such problem is obtaining a good solid bond between the lead finger and the tape. Another is lead finger ↳bounce." Finger bounce occurs during wire bonding when the wire must be bonded from the die pad to the inner lead finger. As the lead finger is heated during placing of the wire bond, the adhesive tape communicating with the finger also heats up. Consequently, the tape softens up and causes the finger to no longer remain solidly attached and immovable. This softening of the tape, in conjunction with the pressure applied in placing the wire bond, causes the lead finger to ↳bounce" and lose its grip with the tape, making it difficult to obtain a good solid bond.

Given the foregoing problems associated with lead frames, lead fingers, and adhesive tape in lead package systems, objects of the present invention are to provide a semiconductor lead package system having improved lead finger adherence to adhesive tape.

SUMMARY OF THE INVENTION

According to principles of the present invention in its preferred embodiment, a lead finger of a lead frame in a lead package system for a semiconductor die includes a tread on a surface of the lead finger for increasing adhesion between the finger and an adhesive tape, the tape communicating between the tread and the die. Advantageously, the tread substantially minimizes lead finger bounce upon wire bonding the lead finger with the die.

According to further principles of the present invention, a method of adhering a lead finger to an adhesive tape is disclosed, comprising the step of placing a surface of the finger having a tread thereon adjacent to and in contact with the adhesive tape.

According to further principles of the present invention, the tread is patterned to provide optimum surface area for adhesion with the adhesive tape. The tread includes a groove and/or cavity stamped or etched in a surface of the lead finger that communicates with the adhesive tape.

The aforementioned principles of the present invention provide an improved lead finger in a lead frame and lead package system, and an improved adherence of the lead finger to an adhesive tape. Other objects, advantages, and capabilities of the present invention will become more apparent as the description proceeds.

DETAILED DESCRIPTION OF THE INVENTION

Figure 1:
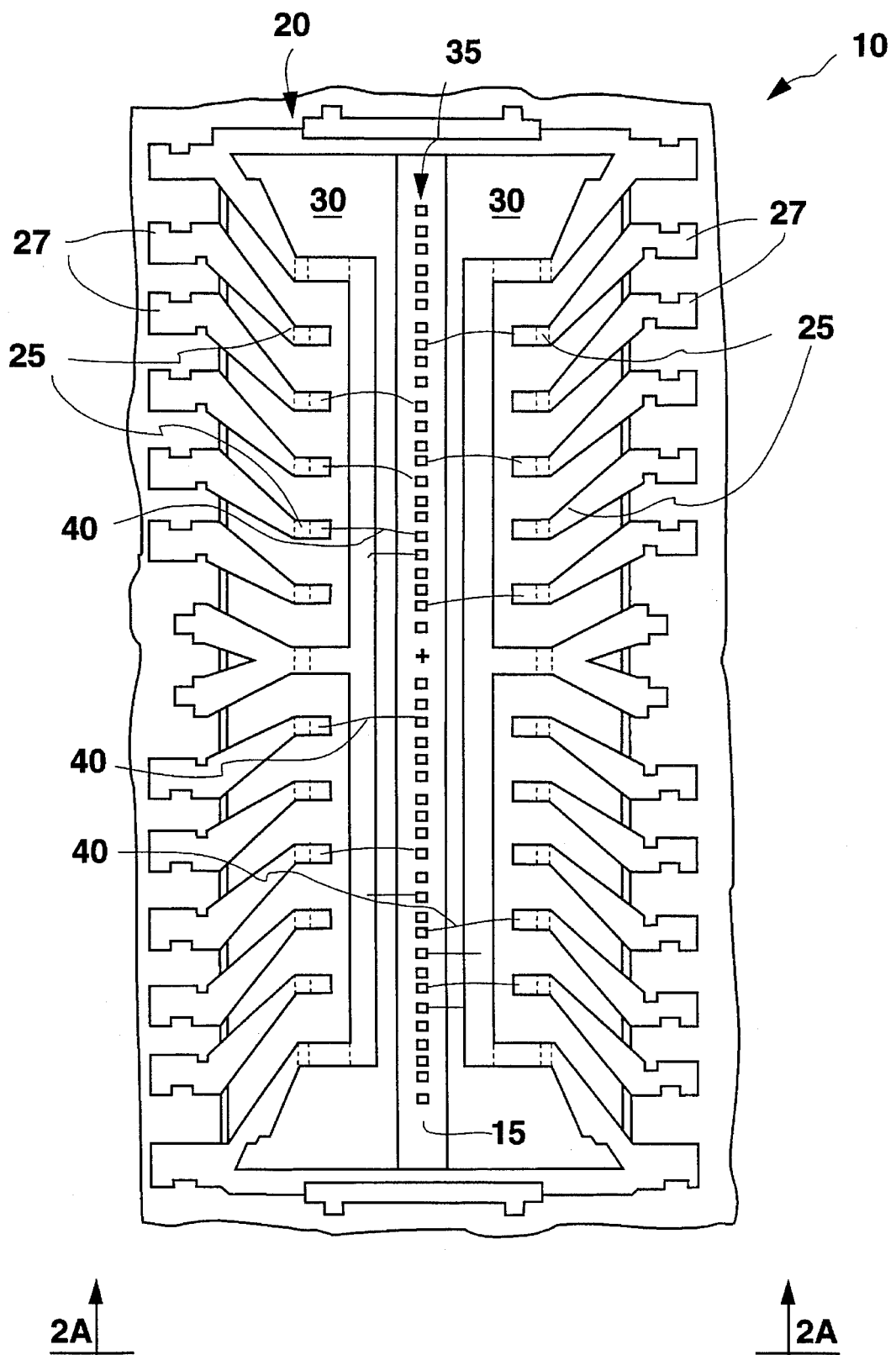
FIG. 1 is a partial broken-away plan view of a packaged IC device.

FIG. 1 depicts a partial broken-away plan view of a packaged IC device 10. Although the present invention lead finger tread is not visible in this view, this view is depicted for a better understanding of the present invention as more fully shown and described in FIGS. 2–3.

Packaged device 10 includes integrated circuit (IC) die (chip) 15 and a lead package system including lead frame 20 placed on die 15. Lead frame 20 includes two adjacent columns of a plurality of lead fingers, depicted as inner and outer lead fingers 25 and 27, respectively. Inner lead fingers 25 are adjacent die pads 35, and outer lead fingers 27 extend outward of the packaged device for connection with appropriate external circuitry.

Insulator adhesive tape strips 30 communicate between inner lead fingers 25 and die 15. Adhesive tape 30 is, typically, a double-sided, thermosetting or thermoplastic, adhesive-coated polyimide film. Tape 30 adheres inner lead fingers 25 to die 15 and protects the conductive fingers from shorting with die 15. Wire bonds 40 communicate between inner lead fingers 25 and die pads 35 for making the electrical connection between the die and the lead fingers.

Figure 2A:
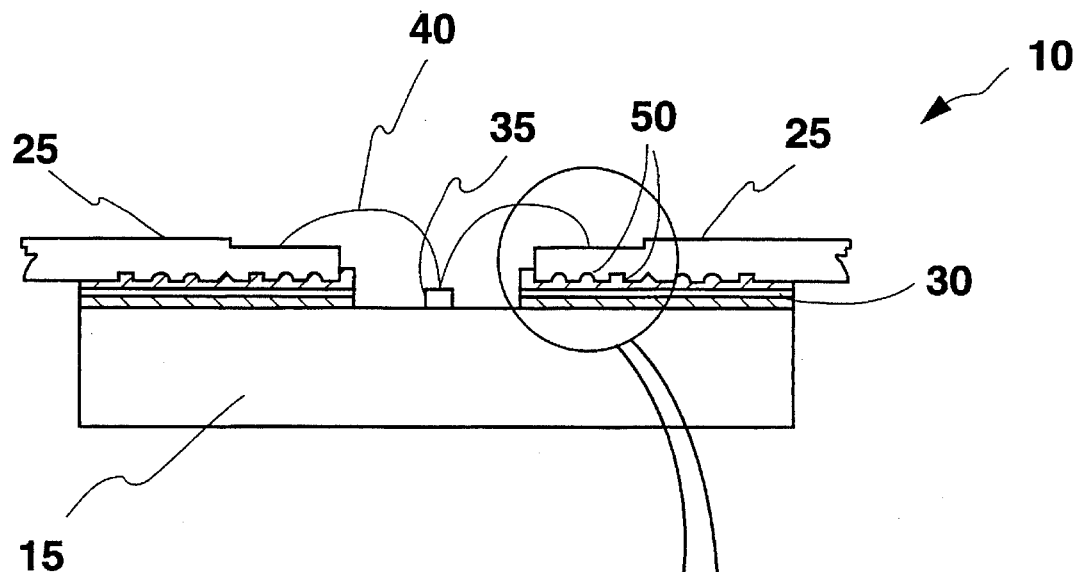
FIG. 2A is a partial end view taken along lines 2A—2A of FIG. 1, depicting the present invention lead finger tread.
Figure 2B:
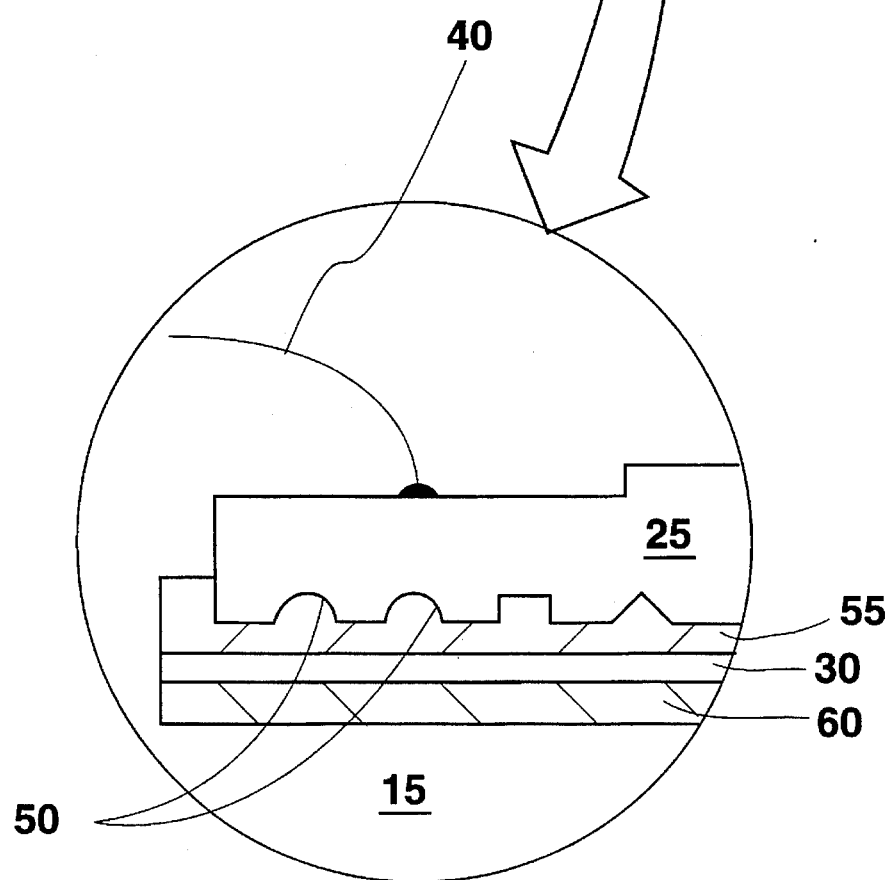
FIG. 2B is an enlarged partial view of FIG. 2A.
Figure 3:
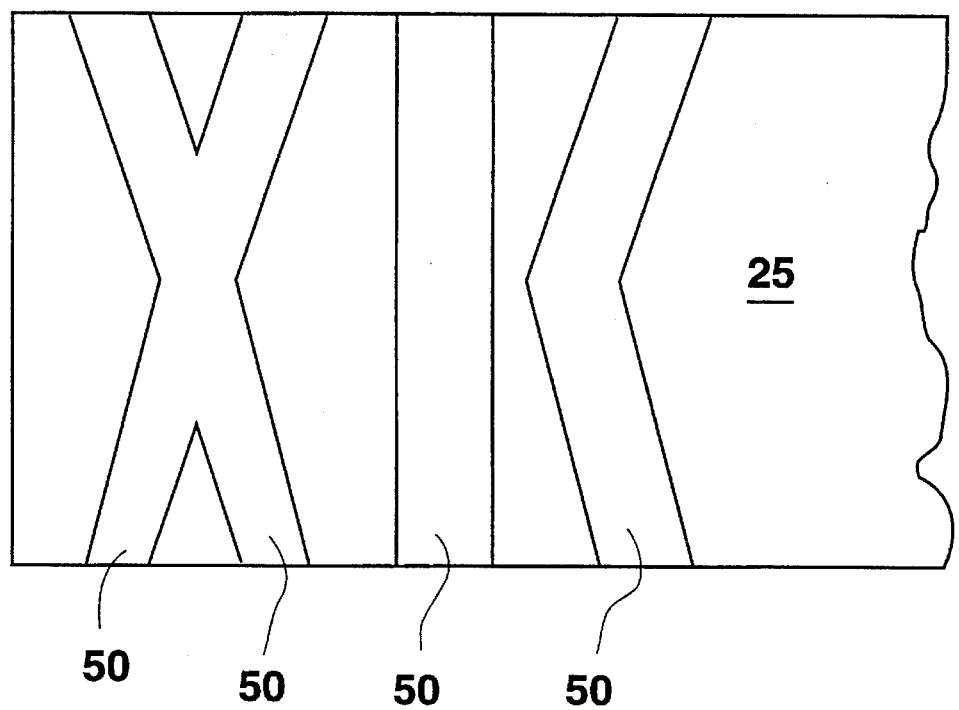
FIG. 3 is a bottom view of the present invention lead finger tread.

The present invention relates to the non-visible portions of inner lead fingers 25 of this drawing, as more fully shown and described in FIGS. 2–3. Like parts are labeled the same.

FIG. 2A is a partial end-view of IC package 10 taken along lines 2A—2A of FIG. 1 and depicts the preferred embodiment of the present invention lead finger 25 having tread 50 on a surface thereof. As shown, adhesive tape 30 communicates between inner lead finger 25 and die 15. Wire bond 40 communicates between die pad 35 and lead finger 25.

Lead finger 25 includes tread 50 on the surface that communicates with tape 30. Tread 50 can be thought of as similar to a tread on a vehicle tire. On a vehicle tire, the tire tread is patterned to provide optimum contact with a given road surface. Likewise, the present invention tread 50 in lead finger 25 provides optimum contact with tape 30. Tread 50 improves adhesion between lead finger 25 and adhesive tape 30.

FIG. 2B is an enlarged partial view of FIG. 2A to more clearly depict the present invention lead finger tread 50. Adhesive tape 30 is shown here to actually be a double-sided adhesive, comprising tape carrier film 30 sandwiched between adhesive substances 55 and 60. Adhesive substance 55 communicates with tread 50 of lead finger 25, and adhesive substance 60 communicates with die 15.

The advantages of having tread 50 on finger 25 is best understood in the context of the wire-bonding process for wire bond 40 between die pad 35 (FIGS. 1 and 2A) and inner lead finger 25. When wire bonding occurs, the inner lead finger conducts the heat applied, and consequently, adhesive substance 55 receives heat and tends to soften up. In the present invention, tread 50 enhances the grip between lead finger 25 and adhesive substance 55 of tape 30, even when the tape softens during wire bonding.

In conventional lead fingers that have only a flat surface in contact with the adhesive tape, the lead finger is more susceptible to losing its grip with the tape because of a lesser surface area in contact with the tape. Consequently, the softening of the tape, in conjunction with the pressure applied in placing the wire bond, causes the conventional lead finger to ⸤bounce" and lose its grip with the tape, making it difficult to obtain a good solid bond.

In contrast, the present invention lead finger 25, having tread 50, substantially minimizes lead finger bounce in the tape to enable a good solid bond therebetween. When lead finger 25 is placed in contact with adhesive substance 55 of tape 30, the adhesive substance forms to and fills the surface area of the tread 50 pattern to provide a stronger locking bond over the prior art. Furthermore, tread 50 acts to receive the adhesive substance rather than tend to push it away as occurs with conventional flat surface lead finger contact. Finally, since tread 50 tends to receive adhesive substance 55, the thickness of the tape directly below lead finger 25 is actually reduced, and consequently, lead finger bounce is substantially reduced during wire bonding.

Further advantages of the present invention reside in the fact that any conventional thermosetting or thermoplastic adhesive tape known in the art is usable, such as that sold under the trade name DUPONT KAPTON. Moreover, no special clamping is needed to avoid the conventional lead finger bounce during wire bonding. Also, by avoiding lead finger bounce with the present invention, a significant advantage is realized through the reduction of time and cost factors associated with the wire-bonding process.

Referring now to FIG. 3, tread 50 is shown as having a particular pattern on the surface of lead finger 25 that communicates with tape 30 (not shown). Because the variations of tread patterns that could be employed are innumerable, the pattern shown is merely exemplary. However, any pattern employed should be designed to provide optimum surface area for adhesion with tape 30.

Tread 50 includes a patterned groove and/or cavity in the surface of lead finger 25 that contacts adhesive tape 30 (not shown). The groove and/or cavity is simply etched or stamped into the surface of lead finger 25. The pattern is etched or stamped to provide optimum surface area for adhesion with the adhesive tape.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A lead frame for wire bonding with a semiconductor die, the lead frame including at least one lead finger having a tread on a surface thereof for increasing adhesion between the finger and an insulator, the insulator disposed between the tread and the die, and wherein the tread is formed as voids in the surface of the lead finger which do not penetrate through the lead finger, the voids having substantially rectilinear walls for providing an optimal tread surface area for contact with the insulator.

2. The lead frame according to claim 1 further including a plurality of lead fingers, and wherein each of the plurality of fingers includes a tread formed as voids which do not penetrate through the lead finger, the voids having substantially rectilinear walls for providing an optimal tread surface area for contact with the insulator.

3. The lead frame according to claim 1 wherein the tread adheres sufficiently to the insulator to substantially minimize lead finger bounce upon wire bonding the lead finger with the die.

4. The lead frame according to claim 1 wherein the insulator forms to and fills the tread surface area upon communicating therewith.

5. The lead frame according to claim 1 wherein the voids are grooves.

6. The lead frame according to claim 1 wherein the voids are cavities.

7. The lead frame according to claim 1 wherein the tread is etched into the surface of the lead finger.

8. The lead frame according to claim 1 wherein the tread is stamped into the surface of the lead finger.

9. The lead frame according to claim 1 wherein the insulator is an adhesive tape.

10. The lead frame according to claim 1 wherein the tread is further formed as voids having rectilinear walls in connection with curvilinear walls.

11. An inner lead finger in a lead package system for wire bonding with a semiconductor die, the lead finger having a tread on a surface thereof for increasing adhesion between the finger and an adhesive tape, the tape communicating between the tread and the die, and wherein the tread is formed as voids in the surface of the lead finger which do not penetrate through the lead finger, the voids having substantially rectilinear walls for providing an optimal tread surface area for contact with the tape, and wherein the tread causes a displacement in the adhesive tape such that (i) the lead finger is positioned closer to the semiconductor die, (ii) lead finger bounce is reduced upon wire bonding the finger with the die, and (iii) bonding of a wire to the finger is improved.

12. The lead finger according to claim 11 wherein the tread is further formed as voids having rectilinear walls in connection with curvilinear walls.

\* \* \* \* \*